United States Patent [19]

Mori

[11] Patent Number: 5,139,969
[45] Date of Patent: Aug. 18, 1992

[54] METHOD OF MAKING RESIN MOLDED SEMICONDUCTOR DEVICE

[75] Inventor: Ryuichiro Mori, Itami, Japan

[73] Assignee: Mitsubishi Denki Kabushiki Kaisha, Japan

[21] Appl. No.: 725,895

[22] Filed: Jul. 1, 1991

Related U.S. Application Data

[62] Division of Ser. No. 598,074, Oct. 16, 1990, abandoned.

[30] Foreign Application Priority Data

May 30, 1990 [JP] Japan .................... 2-138278

[51] Int. Cl.$^5$ .................. H01L 21/283; H01L 21/56; H01L 21/58
[52] U.S. Cl. ................... 437/183; 437/211; 437/217
[58] Field of Search ............ 357/72, 68, 70; 437/183, 203, 207, 211, 214

[56] References Cited

U.S. PATENT DOCUMENTS 4,704,369 11/1987 Nath et al. .................. 437/226

FOREIGN PATENT DOCUMENTS

| 53-10272 | 1/1978 | Japan | 437/203 |
| 55-121662 | 9/1980 | Japan | 437/203 |
| 58-48947 | 3/1983 | Japan | 437/211 |
| 61-220346 | 9/1986 | Japan | . |
| 63-55963 | 3/1988 | Japan | . |
| 0258050 | 10/1988 | Japan | 357/72 |
| 63-308329 | 12/1988 | Japan | 437/183 |
| 0106449 | 4/1989 | Japan | 357/72 |
| 0049460 | 2/1990 | Japan | 357/72 |
| 7606781 | 12/1976 | Netherlands | 357/72 |

Primary Examiner—Olik Chaudhuri
Assistant Examiner—David E. Graybill
Attorney, Agent, or Firm—Leydig, Voit & Mayer

[57] ABSTRACT

A resin molded semiconductor device includes external electrodes provided on and connected to the electrodes of a semiconductor element. The semiconductor device is produced by coating the electrodes of the semiconductor element with a coating resin encapsulating the semiconductor element in a sealing resin in a mold and then dissolving the coating resin. Then, a metal is disposed in the holes formed in the sealing resin to provide external electrodes. Since the external electrodes are provided on the electrodes of the semiconductor element, the packaging area has the same dimensions as the resin package, and the packaging area of the semiconductor device can be reduced.

5 Claims, 4 Drawing Sheets

METHOD OF MAKING RESIN MOLDED SEMICONDUCTOR DEVICE

This application is a divisional of application Ser. No. 07/598,074, filed Oct. 16, 1990, now abandoned.

BACKGROUND OF THE INVENTION

The present invention relates to a resin molded semiconductor device and a method of producing the device. The invention particularly relates to a resin molded semiconductor device which is reduced in size by reducing the packaging area, and a method of producing the device.

FIG. 1 is a perspective view of the outline of a conventional resin molded semiconductor device. In the drawing, a resin molded semiconductor device 1 has a form in which a plurality of leads 3 outwardly project from a sealing resin 2 in which a semiconductor element (not shown) is sealed.

The conventional resin molded semiconductor device 1 having the above arrangement is produced by placing a semiconductor element 8 on the die pad of a lead frame 7 comprising leads 3, a die pad 4, tie bars 5 and a frame 6, securing the semiconductor element 8 to the die pad 4 by using an adhesive material 9 and then electrically connecting electrodes 10 provided on the semiconductor device 8 and the leads 3 by using wires 11, as shown in FIGS. 2 and 3. The sealing resin 2 is then molded using a mold 12, as shown in a sectional view of FIG. 3. The leads are then cut and bent to form the semiconductor device 1 shown in FIG. 1.

In the above-described resin molded semiconductor device 1, since the leads 3 outwardly project from the sealing resin 2, the area of packaging on a substrate is greater than that of the resin package. There is thus a problem in that it is difficult to comply with demands for a further reduction in packaging area.

SUMMARY OF THE INVENTION

The present invention has been achieved with a view to solving the above problem, and it is an object of the present invention to provide a resin molded semiconductor device which requires a packaging area having the same dimensions as those of the resin package and which permits a significant decrease in packaging area, as compared with conventional devices, and a method of producing the semiconductor device.

To this end, the present invention provides a resin molded semiconductor device comprising a semiconductor element, a lead frame including a die pad on which the semiconductor element is placed, a plurality of external electrodes which are provided on electrodes of the semiconductor element, and sealing resin for sealing the semiconductor element, the lead frame and the external electrodes so that the external electrodes are outwardly projected.

The present invention also provides a method of producing a resin molded semiconductor device comprising the steps of applying a coating resin to the electrodes of a semiconductor element, placing the semiconductor element on a die pad of a lead frame, sealing the semiconductor element and lead frame with sealing resin in a mold contacting the surface of the coating resin, removing by using a solvent the coating resin from the electrodes of the semiconductor element sealed with resin to form holes in the sealing resin and disposing metal in the holes to form external electrodes.

DESCRIPTION OF PREFERRED EMBODIMENTS

Figure 1:
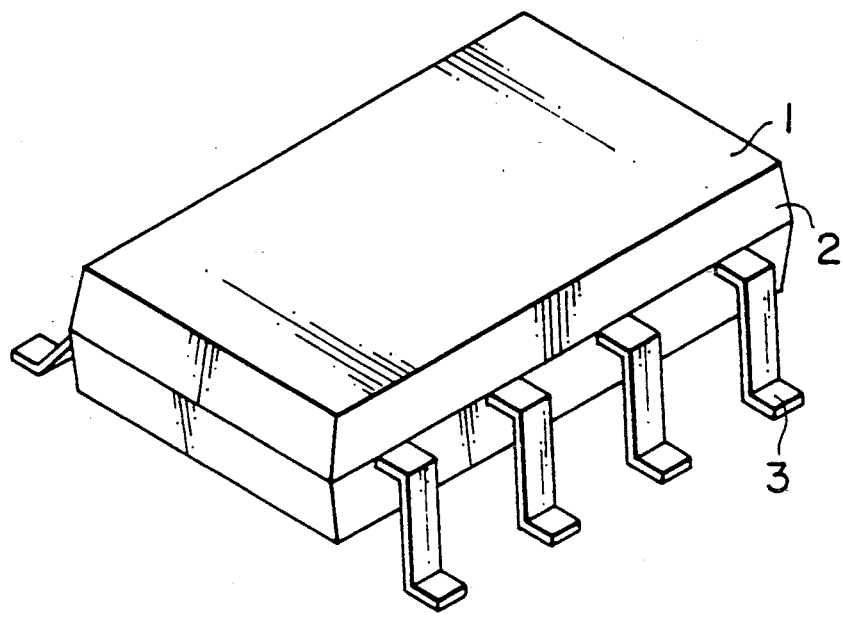
FIG. 1 is a perspective view of a conventional resin molded semiconductor device.
Figure 2:
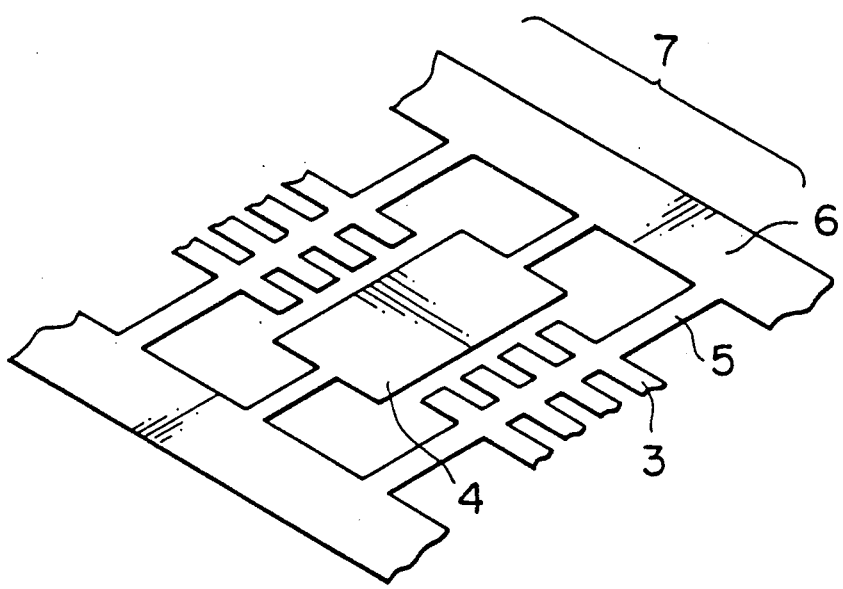
FIG. 2 is a perspective view of the lead frame used in the resin molded semiconductor device shown in FIG. 1.
Figure 3:
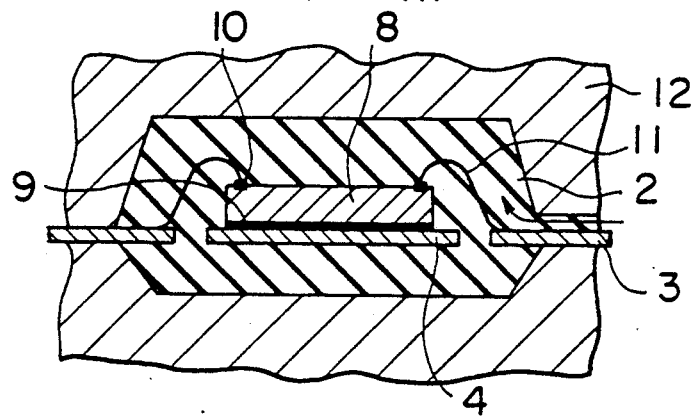
FIG. 3 is a sectional view of the resin molded semiconductor device of FIG. 1 in a mold.
Figure 4:
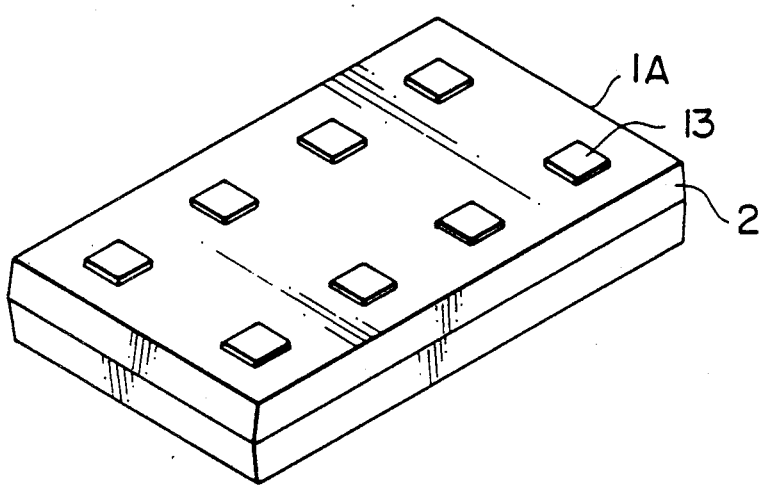
FIG. 4 is a perspective view of a resin molded semiconductor device in accordance with an embodiment of the present invention.

FIG. 4 is a perspective view which shows the outline of a resin molded semiconductor device in accordance with an embodiment of the present invention. In the drawing, a semiconductor device 1A has no projecting leads but has external electrodes 13 on the upper surface of a sealing resin 2.

The resin molded semiconductor device 1A configured as described above is produced as follows.

Figure 5:
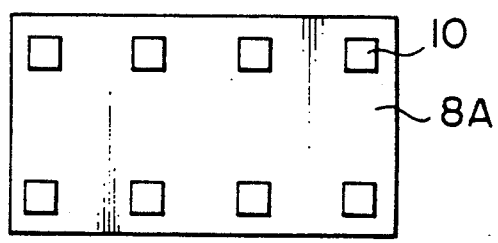
FIG. 5 is a plan view of the semiconductor element used in the resin molded semiconductor device shown in FIG. 4.
Figure 6A:
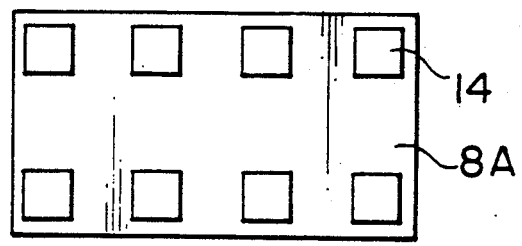
FIGS. 6A and 6B are respectively a plan view and a side view of the semiconductor element shown in FIG. 5 with a coating resin on the electrodes.
Figure 6B:
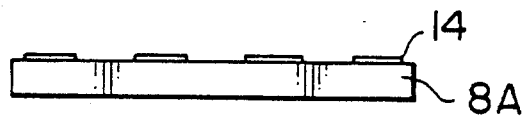
Figure 7:
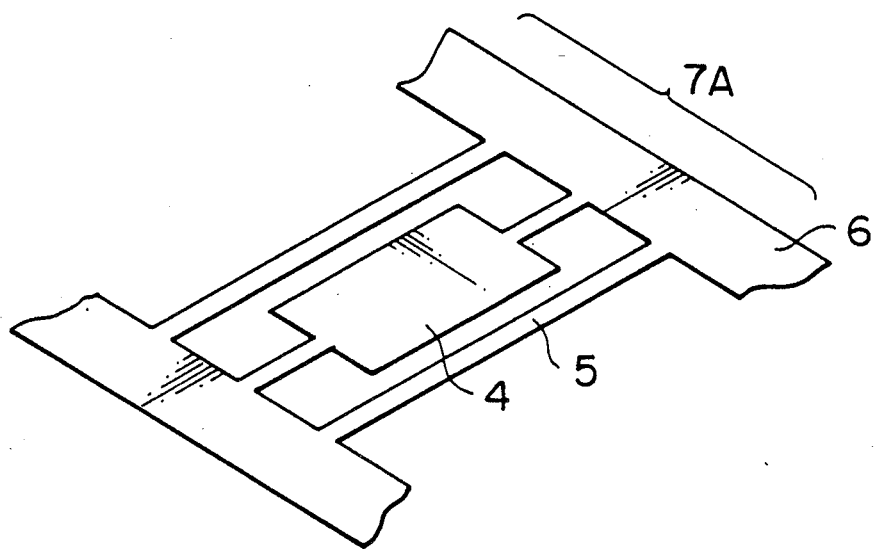
FIG. 7 is a perspective view of the lead frame used in the resin molded semiconductor device shown in FIG. 4.
Figure 8:
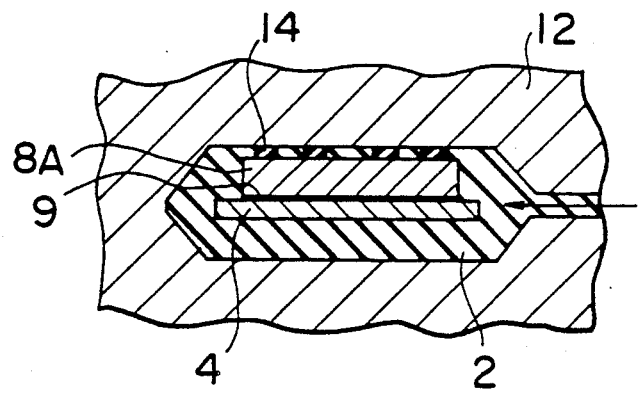
FIGS. 8 to 11 are sectional views which show a series for processes of producing a resin molded semiconductor device in accordance with another embodiment of the present invention.
Figure 9:
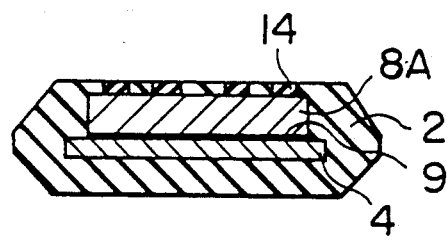
Figure 10:
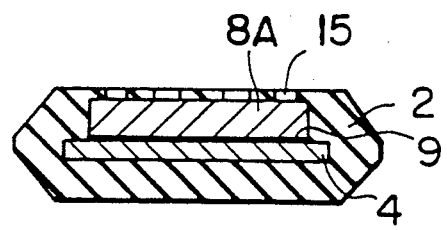
Figure 11:
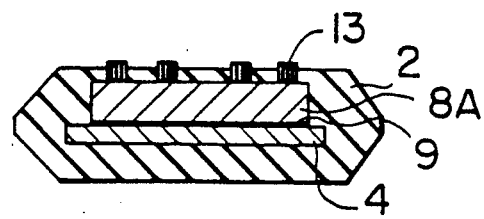

A coating resin 14 is applied to the electrodes 10 of the semiconductor element 8A shown in FIG. 5, as shown in FIGS. 6A and 6B. Examples of the coating resin 14 that can be used include vinyl resins, acrylic resins and the like, which can be removed with a solvent in subsequent steps and which will not easily adhere to the sealing resin 2. The semiconductor element 8A, to which the coating resin 14 has been applied, is then placed on a die pad 4 of a lead frame 7A and secured with an adhesive 9. Since the resin molded semiconductor device in accordance with the present invention uses the external electrodes 13, the lead frame 7A has no leads as shown in FIG. 7. The sealing resin 2 is then injected into a mold 12 so that the coating resin 14 contacts the mold 12 and is subjected to transfer molding, as shown in FIG. 8. FIG. 9 is a sectional view of the thus-formed semiconductor element 8A. When the coating resin 14 is then removed by using a solvent such as acetone, holes 15 are formed in the sealing resin 2 on the electrodes 10, as shown in FIG. 10. A metal is then disposed in the holes 15 by plating or the like to form the external electrodes 13, as shown in FIG. 11. In this way, the resin molded semiconductor device 1A having the appearance shown in FIG. 4 is obtained.

What is claimed is:

1. A method of producing a resin molded semiconductor device comprising:

applying a coating resin to the electrodes of a semiconductor element;

placing said semiconductor element on a die pad of a lead frame;

encapsulating said semiconductor element and lead frame in a sealing resin in a mold with said mold contacting the coated resin;

selectively dissolving said coating resin to form holes in said sealing resin extending to said electrodes; and disposing metal in said holes to form external electrodes.

2. A method according to claim 1 including forming said external electrodes by plating.

3. A method according to claim 1 wherein said coating resin is a vinyl resin.

4. A method according to claim 1 wherein said coating resin is an acrylic resin.

5. A method according to claim 1 including selectively dissolving said coating resin with acetone.

* * * * *